United States Patent
Jung

(10) Patent No.: US 6,350,961 B1
(45) Date of Patent: Feb. 26, 2002

(54) METHOD AND DEVICE FOR IMPROVING SURFACES

(75) Inventor: Thomas Jung, Hotzum (DE)

(73) Assignee: Fraunhofer-Gesellschaft zur Foerderung der Angewandten Forschung E.V. (DE)

( * ) Notice: Subject to any disclaimer, the term of this patent is extended or adjusted under 35 U.S.C. 154(b) by 0 days.

(21) Appl. No.: 09/581,055

(22) PCT Filed: Dec. 8, 1998

(86) PCT No.: PCT/EP98/07910

§ 371 Date: Jul. 28, 2000

§ 102(e) Date: Jul. 28, 2000

(87) PCT Pub. No.: WO99/30347

PCT Pub. Date: Jun. 17, 1999

(30) Foreign Application Priority Data

Dec. 8, 1997 (DE) .......................... 197 55 902

(51) Int. Cl.⁷ .............................. B23K 10/00
(52) U.S. Cl. .................. 219/121.59; 219/121.52; 427/529
(58) Field of Search ................ 219/121.59, 121.52, 219/121.43, 121.48, 121.47; 315/111.21; 156/345; 118/723 MA, 723 HC, 723 ER, 723 MP, 723 R, 723 E; 427/576, 529, 569, 577, 563, 579; 204/192.38, 192.12; 313/37, 38, 231.71, 231.41

(56) References Cited

U.S. PATENT DOCUMENTS 5,457,298 A * 10/1995 Nelson et al. .......... 219/121.52
5,464,667 A * 11/1995 Kohler et al. ................ 427/577
5,627,435 A   5/1997 Jansen et al.
5,846,608 A * 12/1998 Neumann et al. ........... 427/529
6,137,231 A * 10/2000 Anders et al. .......... 315/111.21

FOREIGN PATENT DOCUMENTS

| DE | 42 35 953 A1 | 4/1994 |
| DE | 19 505 268 A1 | 8/1996 |
| EP | 0 634 778 A1 | 1/1995 |
| EP | 0 727 508 A1 | 8/1996 |
| JP | 02 125864 A | 5/1990 |
| JP | 06 275547 A | 9/1994 |

OTHER PUBLICATIONS

Patent Abstracts of Japan, Jul. 24, 1990, vol. 014, No. 342 (C–0743); Citizen Watch Co., Ltd. & Ltd. & JP 02–125864 A, May 14, 1990.

Patent Abstracts of Japan, Dec. 22, 1994, vol. 018, No. 684 (E–1650); Fuji Electric Co. Ltd. & JP 06–275547 A, Sep. 30, 1994.

L. Bardos, H. Barankova, S. Berg; "A new method for film deposition in the discharge of target metal vapour*"; Surface and Coating Technology 72; 1995; pp. 174–180.

* cited by examiner

*Primary Examiner*—Teresa Walberg
*Assistant Examiner*—Quang Van
(74) *Attorney, Agent, or Firm*—Marshall & Melhorn, LLC

(57) ABSTRACT

The invention relates to a method and device for improving the surface of a substrate. Plasma is produced by a luminous discharge, close to the substrate to be treated, using a hollow cathode and an anode assigned thereto. A reactive gas located in the area of the luminous discharge is activated, causing a change to occur on the surface of substrate to provide the desired improvement. The hollow cathode is brought to a self-cleansing temperature and maintained at said temperature, whereby the parasitic deposits caused by the reactive gas are removed and/or converted. The self-cleansing temperature is stabilized by taking into account the following factors: the heating of the hollow cathode by the luminous discharge, thermal conduction carried out by the reactive gas and radiation in the direction of a cooled anode arranged at a small distance from the hollow cathode.

21 Claims, 4 Drawing Sheets

METHOD AND DEVICE FOR IMPROVING SURFACES

BACKGROUND OF THE INVENTION

1. Field of the Invention

The invention relates to a process and a device for improving surfaces, in which the surfaces of objects are improved by applying a layer or the surface properties of the object are improved by modifying the regions close to the surface.

Layers which are very stable and therefore may be very thin, can be applied in most cases only using plasma-assisted processes, since the equilibrium temperatures for layer formation are very high (in most cases far above 800° C.) and most objects are damaged at such temperatures.

The simultaneous plasma-assisted coating of large surfaces with layers of excellent quality has hitherto only been possible in high or fine vacuum. Examples are magnetron sputtering, plasma-activated vapor deposition, vacuum-arc coating and the HF-CVD process. However, high and fine vacuum processes have the disadvantage that the expense in terms of apparatus for vacuum production is high and in addition, the treatment time is extended by the times for evacuation and airing of the treatment chamber.

2. Description of the Related Art

Known processes which operate in rough vacuum or even at atmospheric pressure are plasma spraying and the RPJ process (radio frequency plasma jet, L. Bardos, et al., Surface and Coatings Technology 72 (1995), page 174–180). These processes do indeed achieve very high layer growth rates, but only on very small surfaces of a few $mm^2$ to $cm^2$. Indeed, these nozzle-like coating tools may be moved for coating larger surfaces by means of a robot, but in order to be able to deposit large quantities of material in a short time, an extremely high electrical power has to be supplied to the tool, which leads to considerable heat and material problems in the tool itself.

A further disadvantage of this process is that material transport is effected by an extremely intensive flow of gas at very high gas speed, resulting in high consumption of working gas.

In addition, the layers grown at considerable local layer growth rates in most cases have reduced quality, in the case of plasma spraying there is merely condensation of molten droplets which do not undergo particularly intimate bonding to one another and to the substrate and in addition form a tight network of pores. In the case of the RPJ process there is also the fact that the energy has to be supplied in the form of high frequency and is converted with very low efficiency, so that on the whole considerable costs for current supply result.

A process for treating substrate surfaces, in which plasma-activation is caused by a hollow cathode luminous discharge (German 19 505 268) and inert gas is passed through the hollow cathode to suppress coating of the cathode surface, is also known. However, this process has four crucial disadvantages. Firstly, a large amount of inert gas is consumed for effective reactive gas displacement from the hollow cathode. Secondly, very large vacuum pumps are required to pump the spent inert gas to the atmosphere. Thirdly, a large part of the plasma energy is lost, since the reactive gas does not pass into the zone of the greatest plasma intensity, and fourthly the process may only be carried out briefly using very low power and hence low layer growth rate, since cathode cooling is not provided and hence there is overheating and destruction of the cathode and damage to the substrate. Inasmuch as cooling is provided, there is the serious disadvantage that high expense in terms of construction is produced when reproducing the hollow cathodes due to the cooling system and in addition the size of the individual hollow cathode plus the distance to the neighboring hollow cathode must have a minimum value, resulting in the process remaining restricted to a pressure range below about 10 mbar, which causes vacuum costs accordingly.

OBJECT OF THE INVENTION

The object of the invention is therefore to provide a process and a device for improving surfaces, which may be operated both in rough vacuum and at atmospheric pressure and by means of which improving of high quality is achieved with good efficiency and without or with only low inert gas consumption.

This object is achieved according to the invention by the features of the independent claims.

SUMMARY OF THE INVENTION

It has been shown, surprisingly, that the hollow cathode cleans itself at a sufficiently high cathode temperature, that is the parasitic deposits stemming from the reactive gas are desorbed, evaporated, atomized or dissolved or at least become electrically conductive. Hence, stable operation of the hollow cathode is possible even without considerable flow of inert gas.

Advantageous further developments and improvements are possible due to the measures given in the sub-claims.

So that the hollow cathode cleans itself, the reactive gas, to which inert gas may be admixed for dilution, may be passed wholly or partly through the hollow cathodes, resulting in the efficiency improving, since the reactive gas may be passed into the zone of greatest plasma intensity.

The cooled anode arranged at a slight distance from the hollow cathode facilitates cooling of the hollow cathode so that the temperature of the hollow cathode stabilizes at the self-cleaning temperature taking into account the heat removal by the reactive gas, that is may be kept at defined temperature conditions. In addition, a thermal resistance may be provided between anode and cathode.

The shape of the cathode may be matched to the shape of the objects to be treated, resulting in it being possible to move the hollow cathode close to the surface to be treated, resulting in it being possible also to work at higher pressure. This is further promoted in that the hollow cathode is formed from a plurality of hollow cathode elements arranged like a matrix.

By way of example to produce structures on the surface the latter may be treated locally or locally differently by for example the hollow cathode matrix being designed as a type of "mask" or the shape of the hollow cathodes being matched according to the required structure.

BRIEF DESCRIPTION OF THE DRAWINGS

Exemplary embodiments are shown in the drawing and are illustrated in more detail in the following description.

DESCRIPTION OF THE PREFERRED EMBODIMENTS

Figure 1:
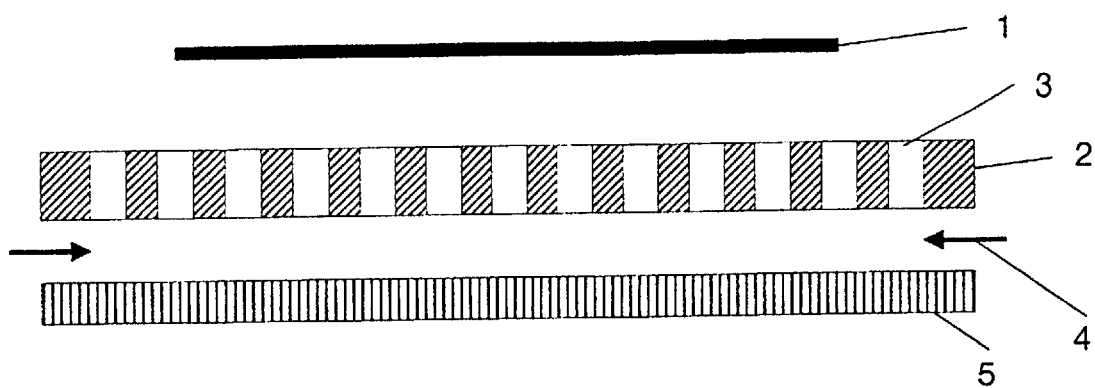
FIG. 1 shows a schematic representation of a first exemplary embodiment of the treatment arrangement of the invention.

The arrangement shown in FIG. 1 for improving the surface has a substrate 1, a hollow cathode 2 being provided opposite it and a cooled anode 5 being provided parallel to the hollow cathode 2. The cooled anode 5 may be designed as a metal plate having cooling channels for the throughflow of a cooling medium, resulting in it being cooled to a defined temperature. A reactive gas supply is designated by 4, wherein the reactive gas is introduced from the side facing away from the substrate 1, so that the reactive gas flows through the hollow cathode 2. The arrangement may be accommodated in a vacuum chamber which is provided with appropriate pumps to produce the vacuum.

The hollow cathode 2 preferably comprises a number of hollow cathode elements 3 which are arranged like a matrix and are produced, for example from a perforated metal sheet or body. In the exemplary embodiment, the hollow cathode elements 3 form a planar or almost planar matrix.

Silicon compounds, hydrocarbons, for example ethine, $H_2$, $O_2$ or $N_2$, may be used as the reactive gas. However, it may also include small quantities of inert gas, for example argon, by means of which the reactive gas is diluted.

After applying a voltage between anode 5 and hollow cathode 2 and supplying the reactive gas, glow discharge takes place in the individual hollow cathode elements 3. The process may thus be carried out in vacuum, in particular rough vacuum, using a vacuum chamber or at atmospheric pressure. The plasma of the hollow cathode discharge activates the gas situated in the hollow cathode 2 and in the gap between hollow cathode 2 and substrate 1, resulting in surface changes being effected on the substrate 1 by condensation of particles (layer formation), by chemical surface reaction or by bombardment with energy-rich particles (removal, diffusion). Condensed particles are chemical reaction products from the gas.

In order to remove or convert the parasitic deposits occurring during the process which stem from the reactive gas at adequate speed, so that they may be removed easily later, the hollow cathode 2 is brought to a self-cleaning temperature and kept at this defined temperature. The hollow cathode 2 is heated preferably by the glow discharge in the cathode itself. The self-cleaning temperature is set and stabilized taking into account this temperature increase due to the glow discharge and heat conduction by the working gas as well as radiation to the cooled anode 5 arranged at a slight distance parallel to the hollow cathode 2. If necessary, a thermal resistance designed as an insulator, for example a ceramic plate, may be provided between the anode and the cathode.

At the self-cleaning temperature, the parasitic deposits are desorbed, evaporated, atomized, dissolved and at least rendered electrically conductive. The self-cleaning temperature depends particularly on the layer material to be deposited and the reactive gas used for it and is, for example for layers of amorphous carbon 400° C.

By surface changes which occur during the process, the following processes are considered: chemical deposition of layers from the gas phase, for example carbon-containing layers from methane or silicon-containing layers from hexamethyldisiloxane; cleaning using plasma-activated oxygen (combustion of hydrocarbon deposits) or oxygen (reduction of oxide deposits); cleaning by (inert gas) ion bombardment in conjunction with substrate biasing; activation of plastic surfaces for the purpose of better adhesion of layers, for example lacquer, by particle bombardment; bombardment using nitrogen, boron or carbon ions to form a diffusion layer.

The process parameters are set according to the different processes. The applied voltage may be between 10 V and 2,000 V, direct voltage or alternating voltage in the low frequency, moderate frequency, high frequency or microwave range, as well as pulsed direct voltage or direct voltage with superposition of pulse, may be selected. The pressure range may be between 1 mbar and 2 mbar.

Figure 2:
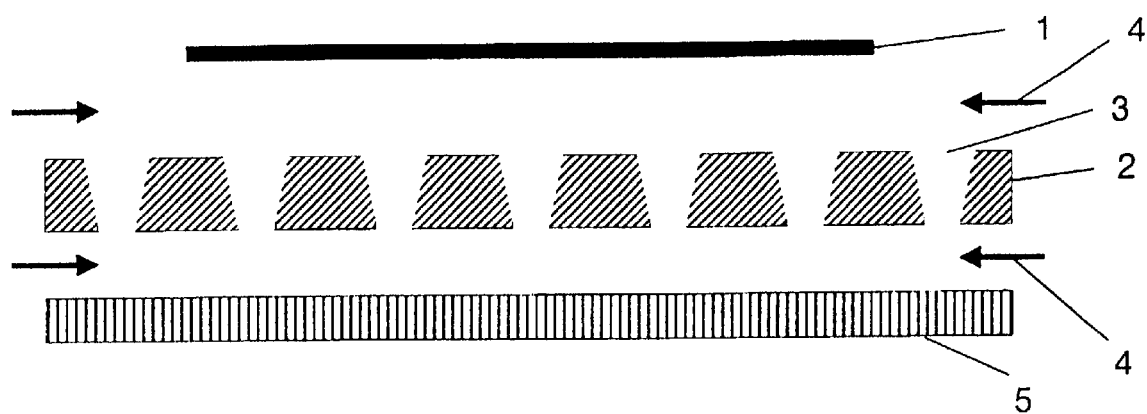
FIG. 2 shows a schematic representation of a second exemplary embodiment of the treatment arrangement of the invention.

FIG. 2 shows a further exemplary embodiment, wherein the reactive gas is introduced in the region between substrate 1 and hollow cathode 2 in addition to the gas inlet 4 according to FIG. 1. Furthermore, the hollow cathode elements 3 are designed to be conical.

Figure 3:
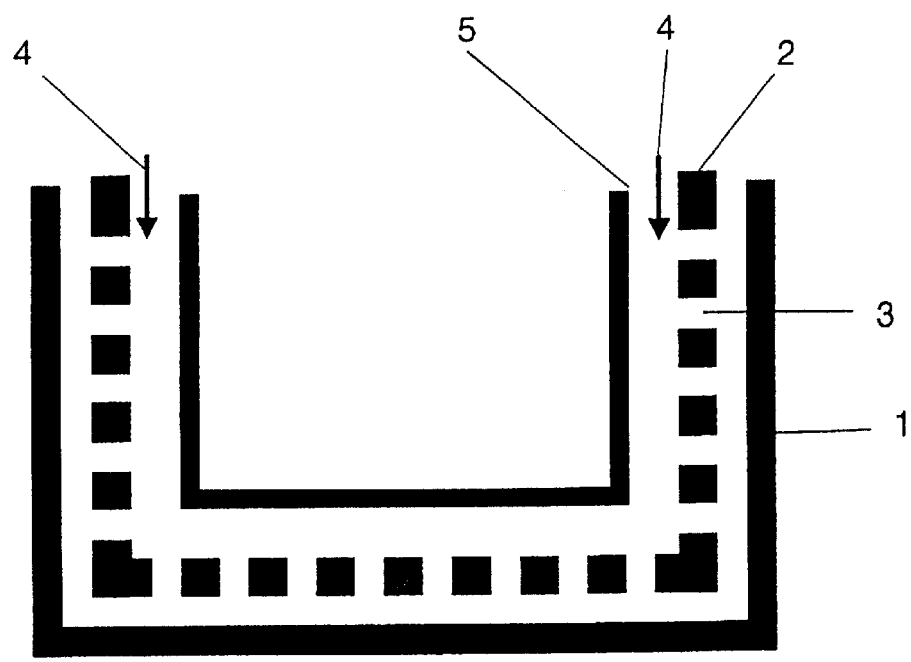
FIG. 3 shows a schematic view of a third exemplary embodiment of the treatment arrangement of the invention.
Figure 4:
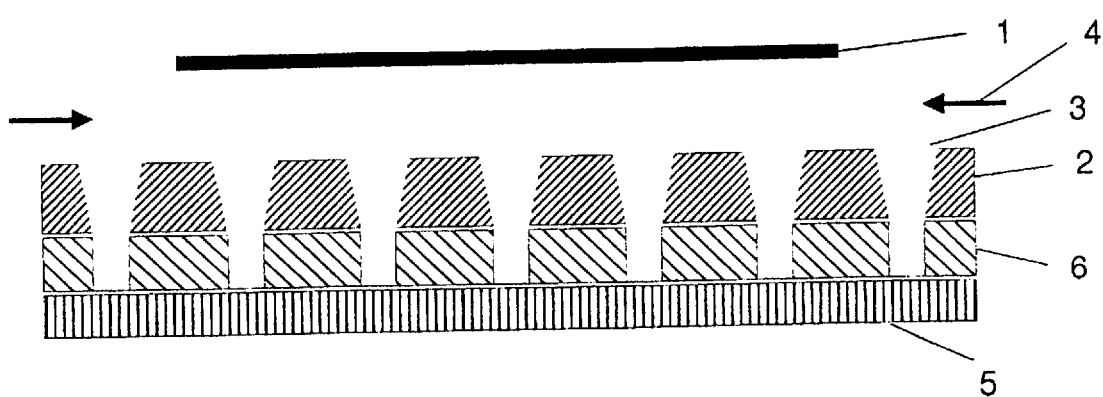
FIG. 4 shows a schematic view of a fourth exemplary embodiment of the treatment arrangement of the invention.

In FIG. 3 a substrate 1 folded at an angle of 90° is to be treated. The hollow cathode 2 and the cooled anode 5 are matched to the shape of the substrate 1, wherein of course other non-flat objects may also be treated with appropriate matching of the hollow cathode 2 or anode 5. Due to this matching, the distance between hollow cathode and substrate may be made small. In FIG. 3 the gas is introduced in turn between anode 5 and hollow cathode 2, so that it flows through the hollow cathode elements 3. It is also conceivable that the gas supply 4 is provided only between hollow cathode 2 and substrate 1. This is shown in FIG. 4, wherein a thermal resistance 6, which may be a ceramic plate, is arranged between cathode 2 and anode 5.

The distance between hollow cathode 2 and substrate surface 1 may preferably be between 10 $\mu$m and 10 mm in the exemplary embodiments shown. The individual hollow cathode elements 3 may preferably have an average diameter of 50 $\mu$m to 5 mm and a depth of 10 $\mu$m to 10 mm. The distance of the individual hollow cathode elements 3 in the hollow cathode matrix may assume a value between the single diameter to ten times the diameter. The shape of the individual hollow cathode elements may be cylindrical, oval, square or conical and the hollow cathode elements may be designed as a through hole or blind hole. The hollow cathode 2 may have a size of 1 $cm^2$ to 10 $m^2$ according to the size of the substrate 1 to be coated.

If, for example a structure is to be produced on the substrate 1, a locally different surface treatment must be carried out. The design of the hollow cathode 2 or the hollow cathode elements in the hollow cathode 2 may then be matched according to the required structure to be produced and/or different shaped hollow cathodes 2 may be combined, for example linear, spiral or the like.

Figure 5:
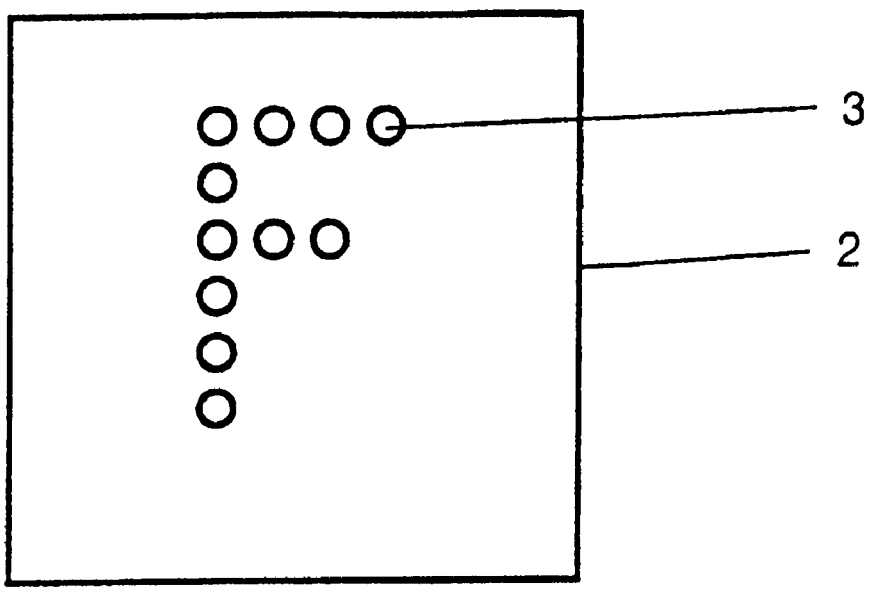
FIG. 5 shows a view of two embodiments of hollow cathodes.
Figure 5:
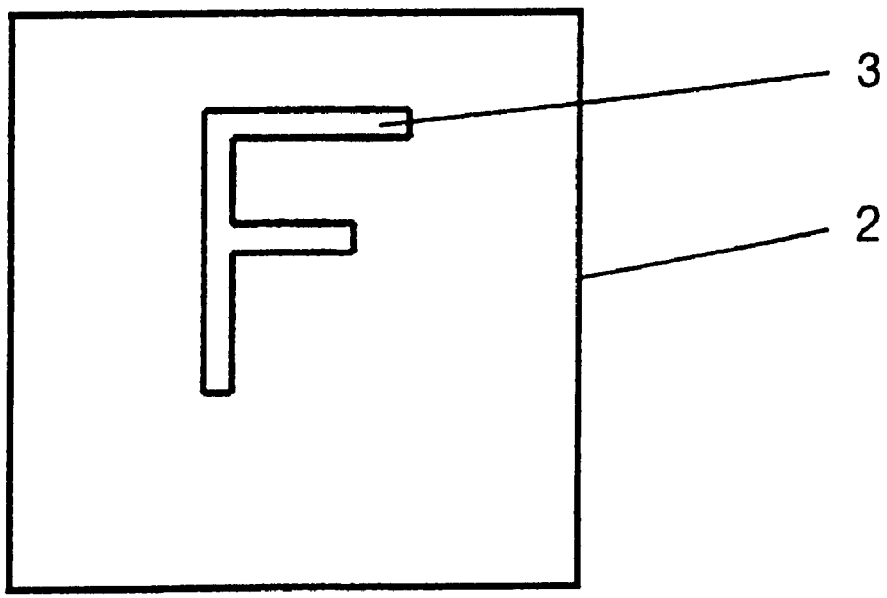

FIG. 5 shows, for example a design of a hollow cathode 2 in the form of an F, which in FIG. 5 at the top consists of circular hollow cathode elements 3 and at the bottom of linear hollow cathode elements 3.

The substrate may also be cooled in addition to or instead of the anode.

What is claimed is:

1. Process for improving a surface of a substrate, in which a plasma is produced by a glow discharge by means of a hollow cathode and an assigned anode in the vicinity of the substrate to be treated and a reactive gas situated in the region of the glow discharge is activated which affects surface changes on the substrate, characterized in that the hollow cathode is brought and kept at a self-cleaning temperature, at which parasitic deposits stemming from the reactive gas and from the substrate are removed and/or converted.

2. Process according to claim 1, characterized in that the reactive gas is introduced wholly or partly through the hollow cathode and/or past it in the gap between substrate and hollow cathode.

3. Process according to claim 1, characterized in that the temperature of the hollow cathode is stabilized at the self-cleaning temperature by heating the hollow cathode by the glow discharge and cooling via the anode or the substrate, wherein the cooling takes place via heat radiation or heat conduction by the reactive gas, the reactive gas directed to the cool anode or to the substrate to be cooled.

4. Process according to claim 3, characterized in that the anode and/or the substrate is cooled.

5. Process according to claim 1, characterized in that a thermal resistance is arranged between the anode and the cathode.

6. Process according to claim 1, characterized in that the glow discharge is produced in rough vacuum or at atmospheric pressure.

7. Process according to claim 1, characterized in that a plurality of glow discharges are produced by a plurality of hollow cathode elements.

8. Process according to claim 1, characterized in that the surface of the substrate is treated locally differently.

9. Process according to claim 1, characterized in the either the entire surface is to be treated, wherein the shape and the design of the hollow cathode is matched to the shape of the surface to be treated, or a design to be formed in the surface, wherein the hollow cathode is matched to the design to refine the surface of the substrate.

10. Device for improving the surface of a substrate having a hollow cathode arranged in fixed assignment to the substrate, a cooled anode and at least one gas inlet for supplying reactive gas, wherein the cooled anode is arranged on the side of the hollow cathode facing away from the substrate such that the hollow cathode can be stabilized by the action of the cooled anode and via heat conduction of the reactive gas at a temperature permitting self-cleaning of the hollow cathode from parasitic deposits.

11. Device according to claim 10, characterized in that the anode (5) is arranged parallel to the hollow cathode (2).

12. Device according to claim 10, characterized in that a thermal resistance (6) is arranged between hollow the cathode (2) and the anode (5).

13. Device according to claim 10, characterized in that the hollow cathode (2) comprises a plurality of hollow cathode elements (3) arranged next to one another.

14. Device according to claim 13, characterized in that the hollow cathode elements (3) are designed to be circular or linear or arranged like a matrix.

15. Device according to claim 9, characterized in that the shape of the hollow cathode (2) is matched to the shape or contour of the surface (1) to be treated.

16. Device according to claim 9, characterized in that the shape and/or the design of the hollow cathode (2) is matched to a structure required after treatment or a design on the surface required after treatment.

17. Device according to claim 10, characterized in that the gas inlet (4) for the reactive gas is arranged such that the gas flows at least partly through the hollow cathode (2).

18. Device according to claim 10, characterized in that the distance between the hollow cathode (2) and a substrate surface is between 10 $\mu$m and 10 mm.

19. Device according to claim 18, characterized in that each of hollow cathode elements (3) have an average diameter between 50 $\mu$m and 5 mm and a depth between 100 $\mu$m and 10 mm.

20. Device according to claim 10, characterized in that the distance between each of hollow cathode electrodes (3) is 1 to 10 times their diameter.

21. Device according to claim 10, characterized in that the substrate is cooled.

* * * * *